May 4, 1965 E. J. GLAISHER Re. 25,772

TIME-BASE CIRCUIT FOR MAGNETIC BEAM DEFLECTION

Original Filed Aug. 22, 1960

INVENTOR
EDWARD J. GLAISHER

BY
AGENT

United States Patent Office

Re. 25,772
Reissued May 4, 1965

25,772
TIME-BASE CIRCUIT FOR MAGNETIC BEAM DEFLECTION

Edward James Glaisher, Horley, England, assignor to North American Philips Company, Inc., New York, N.Y., a corporation of Delaware Original No. 3,133,228, dated May 12, 1964, Ser. No. 51,199, Aug. 22, 1960. Application for reissue June 15, 1964, Ser. No. 386,471
Claims priority, application Great Britain Sept. 2, 1959
10 Claims. (Cl. 315—27)

Figure 1:
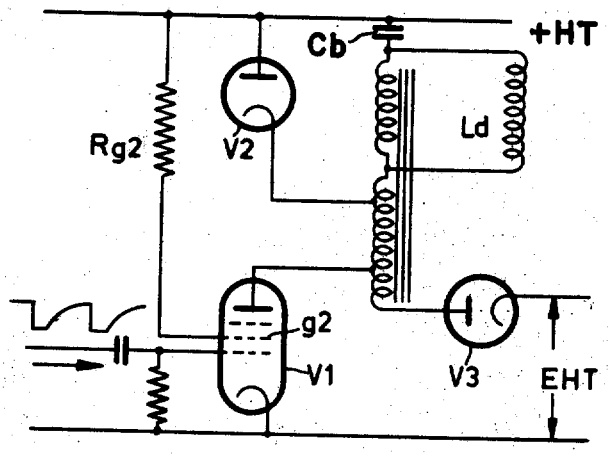
FIG.1 PRIOR ART

Matter enclosed in heavy brackets [ ] appears in the original patent but forms no part of this reissue specification; matter printed in italics indicates the additions made by reissue.

This invention relates to time-base circuits for magnetic beam deflection and more particularly to line time-base circuits for television and similar type cathode-ray tube display systems.

With the introduction of small-depth picture tubes having wide deflection angles of about 110°, certain problems have arisen or become more acute, and one of these will be explained by referring to FIGURE 1 of the accompanying drawing which shows a conventional line time-base circuit. The circuit includes the following elements:

V1=line output valve
V2=booster diode
V3=EHT rectifier
Cb=boost condenser
Rg2=screen grid resistor
Ld=deflection coils To obtain a linear scan with a picture tube having a substantially flat screen the circuit must compensate for the changes in the length of the path of the electron beam when traversing the tube face. This requires an expansion of the center portion of the line scan with respect to the ends. Some compensation may be obtained by a suitable choice of the boost condenser Cb. However, for large deflection angles this method of compensation produces unsatisfactory valve operating conditions and it is customary in this case to obtain the compensation by inserting a capacitor in series with the line deflection coils.

The circuit should be designed so that the required deflection is obtained under conditions which will give an adequate expectation of life to the line output valve V1. A common cause of failure of this valve is the inability to supply the required peak anode current after a long period of use, and hence limitations are imposed on the design of the equipment to ensure that the valve is working well inside its rated capabilities. The design limits of peak anode current depend on the screen voltage and hence on resistance Rg2 and the HT supply voltage. Since the peak anode current occurs at the end of the scanning period, the screen grid voltage at the end of the scan must be adequate. This voltage may be increased by a reduction of the value of Rg2 but a limit is reached when the screen grid power dissipation becomes excessive.

According to the present invention a line time-base circuit for magnetic deflection comprises deflection coils connected by way of a capacitor across a winding forming part of an output transformer which is connected to a multi-grid output valve having the usual control grid and a screen grid and adapted to produce a sawtooth current in said deflector coils, and means for applying to the screen grid of said valve a direct voltage in combination with an alternating voltage developed across said capacitor, said capacitor having a value such that, in operation, the screen grid supply voltage is higher at the ends of the line scan than at the center portion thereof.

In such a circuit the capacitor included in the deflection coil circuit may be used to correct for changes in the length of the beampath so as to give better scan linearity.

As will be explained, the screen grid current can be made to flow through the deflection coils thus causing a small steady displacement of the picture, and this can be advantageous in the case of a television receiver of the directly-synchronized type. In such receivers a steady displacement is often applied by permanent magnets so as to centralize the picture on the screen, but these shift magnets are liable to cause distortion of the raster and interfere with the focusing of the beam. They are also apt to cause so-called "corner-cutting" or "corner shading" in tubes employing 110° deflection angles, i.e. they are apt to cause the beam to strike the envelope at the junction between the neck and the cone at maximum deflection.

The reason for this shift requirement (which is likely to be common in 110° directly-synchronized receivers) is that the conventional 110° tube aspect ratio of 5 to 4 requires an overscan in the line direction to give the correct proportions to a 4 to 3 transmitted picture. Hence the ends of the line scan do not appear on the tube face. Advantage is taken of this by increasing the line flyback time until the left hand edge of the picture becomes folded over, thus easing valve operating conditions. When this is done however, the picture content is displaced with respect to the raster (since the line flyback cannot start until after the start of the line synchronizing pulse on a directly synchronized receiver) and by the use of D.C. in the line deflection coils the picture can be centered on the screen with the aid of smaller centering magnets which cause less raster and spot distortion and less "shading" in the corners of the picture. As will be appreciated, since the coils are designed to provide a deflection field which is substantially uniform, the resulting centralizing shift of the raster is obtained with little or no adverse effect on the raster shape and spot size. If the flyback is made to continue beyond the end of the "back porch" of the transmitted waveform in accordance with a known technique requiring blanking of the first part of the video signal, the need for a steady shift is correspondingly accentuated.

In a preferred arrangement the transformer is an auto-transformer having a first and second winding wound on a common core and connected in series with each other between the aforesaid capacitor and the anode of the valve, which windings are connected to each other through a capacitive A.C. connection [, and the]. *The* circuit *also* includes a rectifier connected as an efficiency diode between a D.C. supply terminal and the auto-transformer winding nearest to the anode of said valve, means for applying to the screen grid an A.C. voltage appearing at the junction between said capacitor and auto-transformer, and means for connecting the deflection coils across the series combination of said capacitor and the adjacent winding.

In this arrangement it is preferable for the screen grid to be connected through a screen-grid resistance to the junction between said capacitor and the auto-transformer. This has the advantage of causing the D.C. screen-grid current to flow through the deflection coils as aforesaid. In addition, the D.C. screen-grid current is thereby made to flow through the part of the line transformer supplying the deflection coils in such manner as to produce a flux in the transformer core in opposition to that produced by the anode current of the line output valve. This reduces the total D.C. flux in the transformer core, giving a reduction in losses and reduced magnetostriction.

Figure 2:
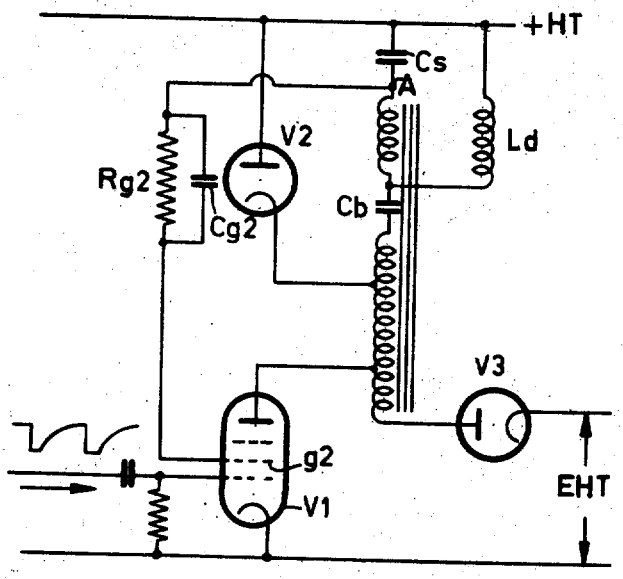

A specific embodiment of the invention having the aforementioned preferred features will now be described by way of example with reference to FIGURES 2 and 3 of the accompanying drawing as applied to a line time-base circuit employing a vacuum pentode valve for use with a 110° deflection television display system.

Comparing the circuit with FIGURE 1, the boost [condenser] *capacitor* Cb has been repositioned so as to act as an A.C. connection between the first and second windings of the auto-transformer but this in itself has no effect on the operation. A capacitor Cs is included in the deflection coil circuit to give the required scan linearity and is so positioned that the voltage at point A has a line-frequency alternating voltage of the form shown in FIGURE 3 (this alternating voltage is produced by the sawtooth current flowing in capacitor Cs).

The screen grid resistor Rg2 is connected to point A so that the screen-grid supply voltage is increased at the end of a line scan but decreased in the middle of a line scan. This allows a higher voltage on screen-grid g2 at the end of scan without any increase in screen power dissipation, and hence permits the valve to supply larger scanning currents.

Figure 3:
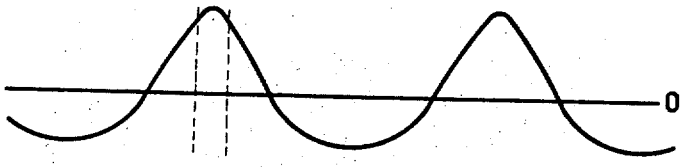

If desired, a capacitor Cg2 may be connected in parallel with the resistor Rg2, to ensure that the alternating voltage as shown in FIGURE 3 is not attenuated, if resistor Rg2 should be large. If resistor Rg2 is small, capacitor Cg2 can be omitted.

A practical set of values and components suitable for the circuit of FIGURE 2 as applied to the British system is given by way of illustration in the following table:

TABLE

| | |
|---|---|
| Valve V1 | Mullard type PL81. |
| Valve V2 | Mullard type PY81. |
| Valve V3 | Mullard type EY86. |
| Resistor Rg2 | 2200Ω. |
| Capacitor Cs | 1 μf. |
| Capacitor CB | 56,000 pf. |
| Coils Ld | 2.7 mh. |

With the above values the line-frequency alternating voltage obtained at point A has a value of about 30 v. peak-to-peak. This receiver uses relatively low impedance deflection coils (2.7 mh.) and hence capacitor Cs is required to have a large value for 110° scanning. For receivers using higher impedance deflection coils a smaller capacitance value would be required giving a larger alternating voltage and hence more benefit to the screen-grid supply voltage. If the deflection coil impedance is too high, the screen-grid loading on the transformer may become appreciable.

With the values of the table, the D.C. flux in the transformer core is reduced by about 25%. A greater reduction could be obtained by the use of deflection coils having higher impedance.

The picture shift and D.C. flux cancellation may both be increased by returning the anode of the boost valve V2 to point A. However, in the circuit of FIGURE 2 this not not done since the D.C. shift obtained would be too large when using the values of the table with the British system.

What is claimed is:

1. A deflection circuit for producing a sawtooth waveform current in a deflection coil, comprising a multigrid electron discharge device having a screen grid and an anode, a source of operating voltage, output transformer means having first and second inductively coupled windings, means connecting said anode to said first winding, means connecting said first winding to one end of said second winding, a capacitor connected between said source and the other end of said second winding, means connecting said deflection coil in parallel with said second winding and capacitor, whereby a voltage appears at the junction of said capacitor and second winding that has a direct component and an alternating component, and means for connecting said screen grid to said junction whereby at least a portion of said direct and alternating components appear at said screen grid and screen grid current flows through said deflection coil.

2. A line deflection circuit for a television receiver comprising deflection coil means, an output transformer having winding means, a multigrid electron discharge device having at least an anode and a screen grid, means connecting said anode to said winding means for producing a current having a sawtooth-shaped waveform through said winding means, a capacitor, means connecting said deflection coil means and capacitor in parallel with a portion of said winding means whereby a voltage having a direct component and a second component that varies with variations in said current appears across said capacitor, and means for applying at least a portion of said direct component and second component of voltage to said screen grid whereby the voltage at said screen grid is higher at the ends of *a* line scan of said receiver than at the center of said line scan.

3. A line deflection circuit for a television receiver comprising deflection coil means, an auto-transformer having first and second inductively coupled windings, first capacitor means connected between one end of said second winding and a point of constant potential, second capacitor means connected between the other end of said second winding and an end of said first winding, a multigrid output electron discharge device having at least a screen grid and an anode, means connecting said deflection coil means in parallel with said first capacitor means and second winding, means for connecting said anode to said first winding for producing a current having a sawtooth-shaped waveform in said deflection coil means, whereby a voltage having a direct component and a second component that varies with variations in said current appears at the junction of said first capacitor means and second winding, and means for connecting said screen grid to said junction whereby at least a portion of said direct and second components of voltage appear at said screen grid and all of the screen grid current of said device flows in said deflection coil means.

4. The circuit of claim 3, comprising diode means having a cathode connected to said first winding and an anode connected to said point of constant potential.

5. The circuit of claim 3, wherein said means for connecting said screen grid to said junction comprises a resistor.

6. A line deflection circuit for a television receiver comprising deflection coil means, an electron discharge device having at least a cathode, a control grid, a screen grid and an anode, auto-transformer means having first and second inductively coupled windings, a source of operating voltage having first and second terminals, first and second capacitor means, a series circuit of said first capacitor, said second winding, said second capacitor, and said first winding connected in that order between said first terminal and said anode, means connecting said second terminal to said cathode, means connecting said deflection coil means in parallel with said second winding and first capacitor, whereby the voltage at the junction of said first capacitor and second winding has a direct component and a component that varies at the frequency of line scanning of said receiver, diode means having a cathode connected to said first winding and an anode connected to a point of constant potential, and means connecting said junction to said screen grid whereby the voltage at said screen grid is higher at the ends of *a* line scan than in the center of the line scan in said receiver and screen grid current of said device flows through said deflection coil means.

7. The circuit of claim 6, in which the anode of said diode means is connected to said first terminal.

8. A line deflection circuit for a cathode ray tube comprising deflection coil means, an output transformer having first and second inductively coupled windings, a source of operating voltage, a multigrid electron discharge tube having at least an anode, a screen grid, and a control grid, input means for supplying an alternating voltage to said control grid of a given line scan frequency, first capacitance means connected between one end of said second winding and said source of operating potential, means connecting said deflection coil means between said source of operating potential and the other end of said second winding, second capacitance means connected between said other end of said second winding and an end of said first winding, means connecting said anode to said first winding for producing a sawtooth current in said deflection coil means, whereby a voltage appears at the junction of said first capacitance means and second winding that has a direct component and an alternating component of the same frequency as said line scan frequency, and means for connecting said screen grid to said junction so that at least a portion of said direct and alternating components of voltage appear at said screen grid whereby the voltage at said screen grid is higher at the ends of the line scan of said cathode ray tube than at the center of the line scan.

9. Apparatus as defined in claim 8 wherein said means for connecting the screen grid to said junction and said second winding provide a path for screen grid current to flow through said deflection coil means.

*10. A deflection circuit for producing a sawtooth waveform current in a deflection coil, comprising a multigrid electron discharge device having a screen grid and an anode, a source of operating voltage, output transformer means having first and second inductively coupled windings, means connecting said anode to said first winding, a capacitor connected in series with said second winding, means connecting said deflection coil in parallel circuit arrangement with said second winding and capacitor, means connecting said source to said parallel circuit whereby a voltage appears at a terminal of said capacitor having a direct component and an alternating component, and means for connecting said screen grid to said terminal whereby at least a portion of said direct and alternating components appear at said screen grid.*

References Cited by the Examiner

The following references, cited by the Examiner, are of record in the patented file of this patent or the original patent.

UNITED STATES PATENTS

| | | | |
|---|---|---|---|
| 2,599,798 | 6/52 | Wissel | 315—27 |
| 2,743,382 | 4/56 | Lufkin | 315—27 |
| 2,838,662 | 6/58 | Jones et al. | 315—27 X |
| 2,965,796 | 12/60 | Reker et al. | 315—27 |

DAVID G. REDINBAUGH, *Primary Examiner.*